(12) United States Patent
Ogata et al.

(10) Patent No.: US 7,807,328 B2
(45) Date of Patent: Oct. 5, 2010

(54) POLYMER COMPOUND, PHOTORESIST COMPOSITION INCLUDING THE POLYMER COMPOUND, AND RESIST PATTERN FORMATION METHOD

(75) Inventors: Toshiyuki Ogata, Kawasaki (JP); Syogo Matsumaru, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 498 days.

(21) Appl. No.: 10/588,866

(22) PCT Filed: Jan. 20, 2005

(86) PCT No.: PCT/JP2005/000660
§ 371 (c)(1), (2), (4) Date: Aug. 9, 2006

(87) PCT Pub. No.: WO2005/080474
PCT Pub. Date: Sep. 1, 2005

(65) Prior Publication Data
US 2007/0172757 A1    Jul. 26, 2007

(30) Foreign Application Priority Data
Feb. 20, 2004    (JP) ............... 2004-045521

(51) Int. Cl.
G03F 7/00 (2006.01)
G03F 7/004 (2006.01)
(52) U.S. Cl. .................................... 430/270.1; 430/311
(58) Field of Classification Search .............. 430/270.1, 430/281.1, 311
See application file for complete search history.

(56) References Cited

U.S. PATENT DOCUMENTS

| | | | |
|---|---|---|---|
| 6,596,458 B1 | 7/2003 | Sato et al. | |
| 6,686,429 B2 * | 2/2004 | Dammel et al. | 526/297 |
| 6,790,587 B1 * | 9/2004 | Feiring et al. | 430/270.1 |
| 6,821,705 B2 * | 11/2004 | Nagai et al. | 430/270.1 |
| 6,984,482 B2 * | 1/2006 | Jung et al. | 430/273.1 |
| 7,198,880 B2 * | 4/2007 | Sasaki et al. | 430/270.1 |
| 7,217,492 B2 * | 5/2007 | Yoneda et al. | 430/270.1 |
| 7,402,712 B2 * | 7/2008 | Hatakeyama et al. | 568/665 |
| 2003/0044718 A1 * | 3/2003 | Kodama et al. | 430/270.1 |
| 2003/0104312 A1 | 6/2003 | Miya et al. | |
| 2003/0232277 A1 * | 12/2003 | Sasaki et al. | 430/270.1 |
| 2006/0210913 A1 | 9/2006 | Ogata et al. | |
| 2008/0026321 A1 * | 1/2008 | Misumi | 430/270.1 |

FOREIGN PATENT DOCUMENTS

| | | |
|---|---|---|
| EP | 1500977 A1 * | 1/2005 |
| JP | 2003295443 | 10/2003 |
| JP | 2003322970 | 11/2003 |

OTHER PUBLICATIONS

Office Action issued on May 29, 2007, in connection with Korean Patent Application No. 10-2006-7017557.
Hagiwara et al. *J. Photopolym. Sci. Technol.* 16:557-564 (2003).
Houlihan et al. *J. Photopolym. Sci. Technol.* 16:581-590 (2003).
Kawaguchi et al. *Proc. of SPIE.* 5039:43-52 (2003).

\* cited by examiner

*Primary Examiner*—Amanda C. Walke
(74) *Attorney, Agent, or Firm*—Knobbe, Martens, Olson & Bear, LLP

(57) ABSTRACT

The present invention provide a polymer compound whereby the alkali solubility greatly changes before and after exposure in a chemically amplified positive resist, and a photoresist composition including the polymer compound and a resist pattern formation method which can form a fine pattern with high resolution. The photoresist composition and the resist pattern formation method use the polymer compound including at least one substituent group selected from an alcoholic hydroxyl group, a phenolic hydroxyl group, or a carboxyl group as an alkali soluble group (i), wherein the substituent group is protected by an acid dissociable, dissolution inhibiting group (ii) represented by a general formula (1):

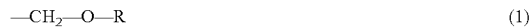

—CH$_2$—O—R    (1)

(wherein R represents an organic group containing no more than 20 carbon atoms and at least one hydrophilic group).

6 Claims, No Drawings

__US 7,807,328 B2__

POLYMER COMPOUND, PHOTORESIST COMPOSITION INCLUDING THE POLYMER COMPOUND, AND RESIST PATTERN FORMATION METHOD

CROSS-REFERENCE TO RELATED APPLICATIONS

This application is the U.S. National Phase filing under 35 U.S.C. §371 of PCT/JP2005/000660, filed Jan. 20, 2005, which designated the United States and was published in a language other than English, which claims priority under 35 U.S.C. §119(a)-(d) to Japanese Patent Application No. 2004-045521, filed Feb. 20, 2004. The content of these applications is incorporated herein by reference in their entireties.

TECHNICAL FIELD

The present invention relates to a polymer compound used for patterning of a semiconductor integrated circuit by means of lithography; a photoresist composition including the polymer compound; and a resist pattern formation method. In detail, the present invention relates to a polymer compound for a photoresist composition with an excellent resolution property in fine patterning by using a light source with a wavelength of 300 nm or less, for example a KrF, ArF, or $F_2$ excimer laser; a photoresist composition including the polymer compound; and a resist pattern formation method.

Priority is claimed on Japanese Patent Application No. 2004-045521, filed Feb. 20, 2004, the content of which is incorporated herein by reference.

BACKGROUND ART

It is no exaggeration that miniaturization of a semiconductor integrated circuit pattern has been accomplished due to the progress of photolithography and peripheral techniques thereof. This photolithography includes two main generally known techniques. One is a technique on an exposure wavelength or a numerical aperture of a reduction projection exposure apparatus known as a stepper or a scanner. The other is a technique on resist properties such as printing resolution of a photoresist composition in which a mask pattern is printed by the aforementioned reduction projection exposure apparatus. These are interacted with each other like two wheels of a car, thereby improving processing accuracy of a semiconductor integrated circuit pattern by means of photolithography.

The wavelength of light sources used in the reduction projection exposure apparatus has been increasingly shortened in response to a demand for high resolution circuit patterns. In general, the g-line (436 nm) or i-line (365 nm) of a mercury lamp is used in the case of a resist resolution of about 0.5 μm or 0.30 to about 0.5 μm, respectively. The main spectra of the g-line and i-line are 436 nm and 365 nm, respectively. Also, a KrF excimer laser (248 nm) or an ArF excimer laser (193 nm) is used in the case of a resist resolution of 0.15 to about 0.30 μm, or about 0.15 μm or less, respectively. Furthermore, use of an $F_2$ excimer laser (157 nm), an $Ar_2$ excimer laser (126 nm), and EUV (extreme ultraviolet light, wavelength: 13 nm) is being investigated in order to further miniaturize a semiconductor integrated circuit pattern.

As far as a photoresist composition is concerned, the life of a photoresist for KrF in lithography using a KrF excimer laser is currently prolonged by combining this photoresist with an organic or inorganic anti-reflective film or by devising an exposure system, and the photoresist composition with an eye to about 110 nm, which is below λ/2, is being developed.

Also, provision of a photoresist composition for ArF has been desired, which is preferable for the mass production of a prospective fine pattern with a node of about 90 nm or less in lithography using an ArF excimer laser. Furthermore, lithography using the aforementioned $F_2$ excimer laser has drawn attention as a technique for processing a prospective fine pattern with a node of 65 nm or less, and a photoresist composition is being developed which is applicable to fine processing by lithography using an $F_2$ excimer laser.

Since it is difficult for a conventional positive photoresist including an alkali soluble novolak resin and a quinone diazide group-containing compound as main components to achieve such a fine pattern, a photoresist applicable to a far-UV ray with a further shortened wavelength (200 to 300 nm); an excimer laser such as KrF, ArF, or F2; an electron beam; and X ray has been desired to be developed. As such a photoresist, a chemically amplified resist has drawn attention and is being actively developed, in which a catalytic reaction and a chain reaction due to acid generated on exposure to radiation can be realized, the quantum yield is 1 or higher, and high resolution and sensitivity can be achieved.

Examples of the chemically amplified resist include a photoresist containing an acetal group, a tertiary alkyl group such as a tert-butyl group, tert-butoxycarbonyl group, or tert-butoxycarbonylmethyl group as an acid dissociable protecting group of a fluorinated alcohol as disclosed in the following non-patent references 1 to 3.

However, in these chemically amplified resists disclosed in non-patent references 1 to 3, the resolution and shape of a resist pattern are not sufficient, and further improvement has been desired.

[Non-Patent Reference 1]
T. Hagiwara, S. Irie, T. Itani, Y. Kawaguchi, O. Yokokoji, S. Kodama, J. Photopolym. Sci. Technol. Vol. 16, Page 557, 2003.

[Non-Patent Reference 2]
F. Houlihan, A. Romano, D. Rentkiewicz, R. Sakamuri, R. R. Dammel, W. Conley, G. Rich, D. Miller, L. Rhodes, J. McDaniels, C. Chang, J. Photopolym. Sci. Technol. Vol. 16, Page 581, 2003.

[Non-Patent Reference 3]
Y. Kawaguchi, J. Irie, S. Kodama, S. Okada, Y. Takebe, I. Kaneko, O. Yokokoji, S. Ishikawa, S. Irie, T. Hagiwara, T. Itani, Proc. SPIE, Vol. 5039, Page 43, 2003.

DISCLOSURE OF INVENTION

The present invention has been accomplished in consideration of the aforementioned problems, and objects of the present invention are to provide a polymer compound including a novel acid dissociable, dissolution inhibiting group, which is excellent in resolution and shape of a resist pattern; a photoresist composition including the polymer compound; and a resist pattern formation method.

To achieve the aforementioned objects, the present inventors have conducted the intensive research in which various acid dissociable, dissolution inhibiting groups were introduced into an alkali soluble group of a polymer compound for a photoresist composition as a protecting group, and the resist characteristics of these polymer compounds were investigated. Then, for the first time, the following was found in the case of using a hydrophilic acid dissociable, dissolution inhibiting group represented by a specific general formula: formation of a fine pattern with improved resolution of a resist pattern, improved adhesion of a resist pattern to a substrate due to the effect of an introduced hydrophilic group, and reduction of developing defects due to improved affinity of a resist pattern to an alkali developing solution. The present invention has been completed on the basis of the above knowledge.

A first aspect of the present invention is a polymer compound including an alkali soluble group (i), wherein at least one hydrogen atom of a hydroxyl group in the alkali soluble group (i) is protected by an acid dissociable, dissolution inhibiting group (ii) represented by a general formula (1):

—CH$_2$—O—R  (1)

(wherein R represents an organic group containing no more than 20 carbon atoms and at least one hydrophilic group), and the polymer compound exhibits changed alkali solubility under the action of acid.

It is preferable that the alkali soluble group (i) be at least one selected from an alcoholic hydroxyl group, a phenolic hydroxyl group, or a carboxyl group. When the alkali soluble group (i) is an alcoholic hydroxyl group, it is more preferable that a carbon atom adjacent to the carbon atom connected to the alcoholic hydroxyl group be bonded to at least one fluorine atom.

It is preferable that the hydrophilic group be at least one selected from a carbonyl group, an ester group, an alcoholic hydroxyl group, ether, an imino group, or an amino group in the aforementioned general formula.

A second aspect of the present invention is a photoresist composition including a base material resin component (A) which exhibits changed alkali solubility under the action of acid; and an acid generator component (B) which generates the acid on exposure to radiation, wherein the base material resin component (A) is the polymer compound of the first aspect.

A third aspect of the present invention is a resist pattern formation method including forming a photoresist film on a substrate using the photoresist composition of the second aspect; exposing the photoresist film; and developing the exposed photoresist film to form a resist pattern.

According to the present invention, by using a polymer compound represented by a specific general formula and including an acid dissociable, dissolution inhibiting group (ii) containing a hydrophilic group in molecule, it is possible to provide a fine pattern with high resolution because alkali solubility is greatly changed before and after exposure in the system of a chemically amplified positive resist. Also, it is possible to prevent thickness loss of the resist pattern. Also, it is possible to improve the adhesion of a resist pattern to a substrate due to the effect of an introduced hydrophilic group and to reduce developing defects due to improved affinity of the resist pattern to an alkali developing solution.

BEST MODE FOR CARRYING OUT THE INVENTION

A detailed description of the present invention is as follows.

A polymer compound of a first aspect of the present invention is characterized in that at least one hydrogen atom of a hydroxyl group in an alkali soluble group (i) in this molecule is protected by an acid dissociable, dissolution inhibiting group (ii) represented by a general formula (1):

—CH$_2$—O—R  (1)

(wherein R represents an organic group containing no more than 20 carbon atoms and at least one hydrophilic group).

When a polymer compound of the present invention is used in the system of a chemically amplified positive resist, a dissolution inhibiting effect in an alkali developing solution is shown before exposure, whereas alkali solubility due to deprotection is shown after exposure and a post exposure bake (hereinafter, abbreviated as "PEB") process because the polymer compound contains a hydrophilic, acid dissociable, dissolution inhibiting group (ii) represented by the aforementioned general formula (1).

Thus, the alkali solubility is greatly changed before and after exposure in the chemically amplified positive resist, so it is possible to provide a fine pattern with high resolution. Also, it is possible to prevent thickness loss of a resist pattern. Also, it is possible to improve the adhesion of a resist pattern to a substrate due to the effect of an introduced hydrophilic group, and to reduce the developing defects due to the improved affinity of a resist pattern to an alkali developing solution. The acid dissociable, dissolution inhibiting group (ii) is bonded to the oxygen atom in which one hydrogen atom has been removed from the hydroxyl group in at least one alkali soluble group (i) selected from an alcoholic hydroxyl group, a carboxyl group, or a phenolic hydroxyl group.

It is preferable that the acid dissociable, dissolution inhibiting group (ii) be represented by the aforementioned general formula (1) in which the hydrophilic group is a carbonyl group, an ester group, an alcoholic hydroxyl group, ether, an imino group, or an amino group.

This hydrophilic group-containing R is an organic group containing no more than 20 carbon atoms and at least one hydrophilic group, and examples thereof include the organic groups represented by the following chemical formulae (2) to (10).

 (2)

 (3)

 (4)

 (5)

 (6)

 (7)

 (8)

 (9)

-continued

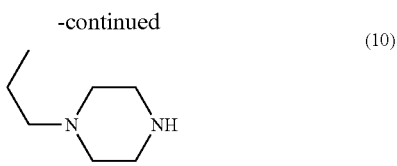

(10)

Preferable examples of this hydrophilic group-containing R include an organic group in which a lower alkoxy group containing 1 to 5 carbon atoms such as a methoxy group or an ethoxy group, a lower alkoxycarbonyl group containing 2 to 6 carbon atoms such as a methoxycarbonyl group or an ethoxycarbonyl group, an acyl group containing 1 to 5 carbon atoms such as an acetyl group or a propionyl group, an amino group, or an imino group is bonded to a linear or branched alkylene group containing 2 to 6 carbon atoms, preferably 2 to 4 carbon atoms; and an organic group such as a lactone ring containing 2 to 6 carbon atoms, a cyclic ether group, or a nitrogen-containing alicyclic group.

An alkali soluble group (i) in a polymer compound of the present invention is known because examples are cited in the aforementioned non-patent references, and a KrF resist, an ArF resist, and an $F_2$ resist have been proposed. These generally known examples can be used in the present invention. Examples of the alkali soluble group (i) include an alcoholic hydroxyl group, a phenolic hydroxyl group, and a carboxyl group, although there is no limitation to these groups.

In the present invention, it is preferable that the alkali soluble group (i) be at least one selected from an alcoholic hydroxyl group, a phenolic hydroxyl group, or a carboxyl group. Among them, an alcoholic hydroxyl group is preferable because it has high transparency and appropriate alkali solubility. Also, it is more preferable that a carbon atom adjacent to the carbon atom connected to the alcoholic hydroxyl group be bonded to at least one fluorine atom.

The alcoholic hydroxyl group can be a simple hydroxyl group; an alcoholic hydroxyl group-containing alkyloxy group such as a hydroxyl group-containing alkyloxy, alkyloxyalkyl, or alkyl group; an alcoholic hydroxyl group-containing alkyloxyalkyl group; or an alcoholic hydroxyl group-containing alkyl group. Examples of an alkyloxy group, an alkyloxyalkyl group, and an alkyl group include a lower alkyloxy group containing 1 to 5 carbon atoms, a lower alkyloxyalkyl group containing 1 to 10 carbon atoms, and a lower alkyl group containing 1 to 5 carbon atoms, respectively.

Specific examples of the lower alkyloxy group include a methyloxy group, an ethyloxy group, a propyloxy group, and a butyloxy group. Specific examples of the lower alkyloxyalkyl group include a methyloxymethyl group, an ethyloxymethyl group, a propyloxymethyl group, and a butyloxymethyl group. Specific examples of the lower alkyl group include a methyl group, an ethyl group, a propyl group, and a butyl group.

Also, at least one or all of the hydrogen atoms of an alkyloxy, alkyloxyalkyl, or alkyl group in the aforementioned alcoholic hydroxyl group-containing alkyloxy, alcoholic hydroxyl group-containing alkyloxyalkyl, or alcoholic hydroxyl group-containing alkyl group may be substituted by a fluorine atom. Preferable examples include an alcoholic hydroxyl group-containing alkyloxy group in which at least one of the hydrogen atom of an alkyloxy part is substituted by a fluorine atom, an alcoholic hydroxyl group-containing alkyloxyalkyl group in which at least one of the hydrogen atoms of an alkyloxy part is substituted by a fluorine atom, and an alcoholic hydroxyl group-containing alkyl group in which at least one of the hydrogen atoms of an alkyl group is substituted by a fluorine atom. In other words, preferable examples include an alcoholic hydroxyl group-containing fluoroalkyloxy group, an alcoholic hydroxyl group-containing fluoroalkyloxyalkyl group, or an alcoholic hydroxyl group-containing fluoroalkyl group.

Examples of the alcoholic hydroxyl group-containing fluoroalkyloxy group include a 2-bis(trifluoromethyl)-2-hydroxy-ethyloxy group $((HO)C(CF_3)_2CH_2O-)$ and a 3-bis(trifluoromethyl)-3-hydroxypropyloxy group $((HO)C(CF_3)_2CH_2CH_2O-)$. Examples of the alcoholic hydroxyl group-containing fluoroalkyloxyalkyl group include a $(HO)C(CF_3)_2CH_2O-CH_2-$ group and a $(HO)C(CF_3)_2CH_2CH_2O-CH_2-$ group. Examples of the alcoholic hydroxyl group-containing fluoroalkyl group include a 2-bis(trifluoromethyl)-2-hydroxy-ethyl group $((HO)C(CF_3)_2CH_2-)$ and a 3-bis(trifluoromethyl)-3-hydroxypropyl group $((HO)C(CF_3)_2 CH_2CH_2-)$.

Examples of the phenolic hydroxyl group include phenolic hydroxyl groups of a novolak resin and polyhydroxystyrene, and they are inexpensive and readily available. Among them, a phenolic hydroxyl group of polyhydroxystyrene is preferable because it is excellent in resolution and appropriate for a fine pattern.

Examples of the carboxyl group include a carboxyl group of an ethylenic unsaturated carboxylic acid. Examples of this ethylenic unsaturated carboxylic acid include an unsaturated carboxylic acid such as acrylic acid, methacrylic acid, maleic acid, or fumaric acid. Among them, acrylic acid and methacrylic acid are preferable because they are inexpensive and easily available.

The polystyrene equivalent weight average molecular weight determined using GPC of a polymer compound of the present invention can be 5,000 to 80,000, preferably 8,000 to 50,000, more preferably 8,000 to 20,000, although there is no limitation to these ranges. Also, the degree of dispersion (Mw/Mn) is about 1.0 to 5.0, preferably 1.0 to 2.5, more preferably 1.0 to 2.0.

A polymer compound of the present invention can be composed of one, or two or more selected from monomer units including the alcoholic hydroxyl group, the phenolic hydroxyl group, or the carboxyl group. A polymer compound can further include a unit of a conventional polymer compound for a photoresist composition, or can be mixed and used with this conventional polymer compound.

Examples of a polymer compound including an alkali soluble group (i), which is a precursor of a polymer compound of the present invention, include a polymer compound including a monomer unit derived from a compound containing an alcoholic hydroxyl group represented by the following chemical formulae (11) to (19) in which a carbon atom adjacent to the carbon atom connected to the alcoholic hydroxyl group is bonded to at least one fluorine atom; a polymer compound including a monomer unit derived from a compound containing a phenolic hydroxyl group such as an α-methylhydroxystyrene unit or a hydroxystyrene unit represented by the following chemical formula (20); and a polymer compound including a monomer unit derived from a compound containing a carboxyl group such as acrylic acid or methacrylic acid represented by the following chemical formula (21).

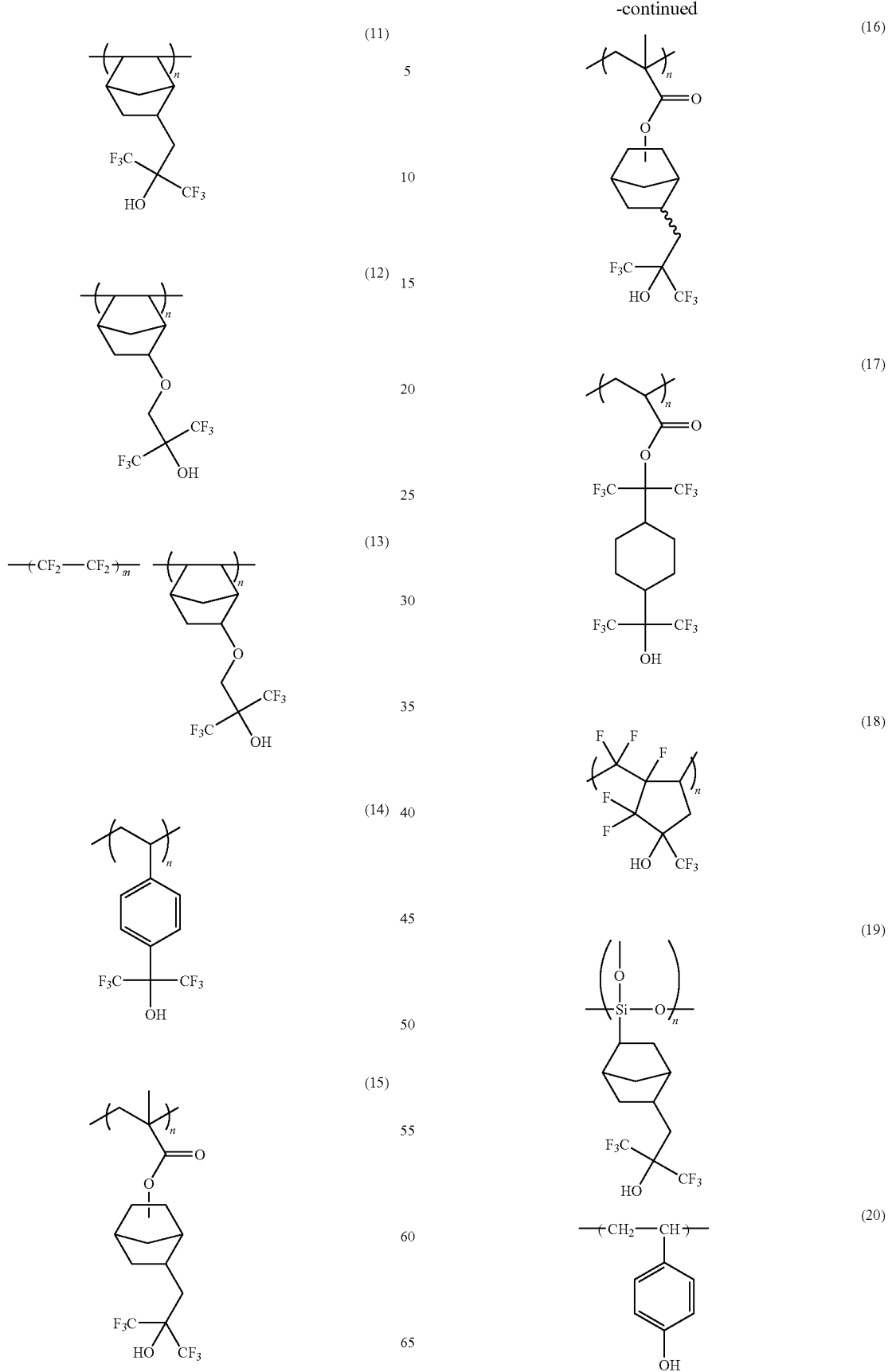

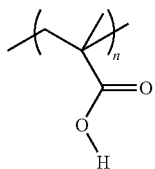
(21)

A generally known low molecular compound containing at least one alkali soluble group (i) selected from an alcoholic hydroxyl group, a carboxyl group, or a phenolic hydroxyl group can be used as a low molecular compound for a photoresist compound which is used as a dissolution inhibitor when a hydrogen atom of a hydroxyl group in the alkali soluble group (i) is substituted by an acid dissociable, dissolution inhibiting group (ii) represented by the aforementioned general formula (1). In the low molecular compound for a photoresist composition, an alkali soluble group (i) in this molecule is protected by an acid dissociable, dissolution inhibiting group (ii) represented by the aforementioned general formula (1).

When the low molecular compound for a photoresist composition is used as an acid dissociable, dissolution inhibitor (C) in the system of a chemically amplified positive resist, a dissolution inhibiting effect in an alkali developing solution is shown before exposure, whereas alkali solubility due to deprotection is shown after exposure and a PEB process. Thus, the alkali solubility is greatly changed before and after exposure in the chemically amplified positive resist, so it is possible to provide a fine pattern with high resolution. Also, it is possible to prevent thickness loss of a resist pattern. Also, it is possible to improve the adhesion of a resist pattern to a substrate due to the effect of an introduced hydrophilic group, and to reduce the developing defects due to the improved affinity of a resist pattern to an alkali developing solution.

An acid dissociable, dissolution inhibiting group (ii) in the low molecular compound for a photoresist composition is the same as an acid dissociable, dissolution inhibiting group (ii) in a polymer compound of the present invention, and is bonded to the oxygen atom in which one hydrogen atom has been removed from an alkali soluble group (i) in a low molecular compound containing at least one alkali soluble group (i) selected from an alcoholic hydroxyl group, a carboxyl group, or a phenolic hydroxyl group.

The acid dissociable, dissolution inhibiting group (ii) is represented by the above general formula (1) in which the hydrophilic group is preferably a carbonyl group, an ester group, an alcoholic hydroxyl group, ether, an imino group, or an amino group.

Examples of this hydrophilic group-containing R include the organic groups represented by the following chemical formulae (2) to (10).

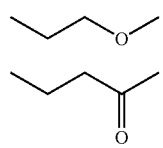
(2)
(3)

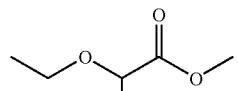
(4)

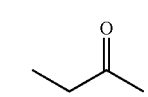
(5)

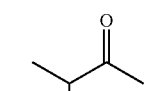
(6)

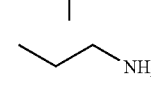
(7)

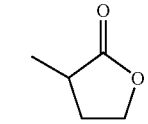
(8)

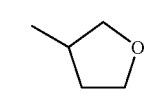
(9)

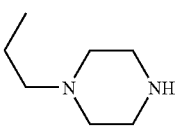
(10)

Preferable examples of this hydrophilic group-containing R include an organic group in which a lower alkoxy group containing 1 to 5 carbon atoms such as a methoxy group or an ethoxy group, a lower alkoxycarbonyl group containing 2 to 6 carbon atoms such as a methoxycarbonyl group or an ethoxycarbonyl group, an acyl group containing 1 to 5 carbon atoms such as an acetyl group or a propionyl group, an amino group, or an imino group is bonded to a linear or branched alkylene group containing 2 to 6 carbon atoms, preferably 2 to 4 carbon atoms; and an organic group such as a lactone ring containing 2 to 6 carbon atoms, a cyclic ether group, or a nitrogen-containing alicyclic group.

An alkali soluble group (i) in the low molecular compound for a photoresist composition is known because a KrF resist, ArF resist, and $F_2$ resist have been proposed, and these generally known examples can be used in the present invention. Examples of the alkali soluble group (i) include an alcoholic hydroxyl group, a phenolic hydroxyl group, and a carboxyl group, although there is no limitation to these groups.

In the low molecular compound for a photoresist composition, it is preferable that the alkali soluble group (i) be at least one selected from an alcoholic hydroxyl group, a phenolic hydroxyl group, or a carboxyl group. Among them, an alcoholic hydroxyl group is preferable because it has high transparency and appropriate alkali solubility. Also, it is more preferable that a carbon atom adjacent to the carbon atom connected to the alcoholic hydroxyl group be bonded to at least one fluorine atom.

Examples of the low molecular compound for a photoresist composition include a compound containing the alcoholic hydroxyl group represented by the following chemical formulae (22) and (23) in which a carbon atom adjacent to the carbon atom connected to the alcoholic hydroxyl group is bonded to at least one fluorine atom, a compound containing a carboxyl group described below, and a compound containing a phenolic hydroxyl group described below.

(22)

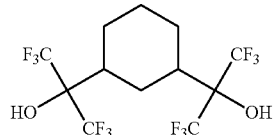

(23)

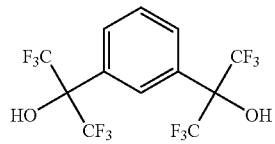

Examples of the compound containing a carboxyl group include a bile acid such as cholic acid, which is known as a precursor of a dissolution inhibitor of a chemically amplified resist, and lithocholic acid As the compound containing a phenolic hydroxyl group, a polyphenol compound can be used, which is known as a sensitizer or a thermal resistance enhancer in a non-chemically amplified g-line or i-line resist. Examples of the polyphenol compound include bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, bis(4-hydroxy-3,5-dimethylphenyl)-2-hydroxyphenylmethane, bis(4-hydroxy-3,5-dimethylphenyl)-4-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(4-hydroxy-3-methylphenyl)-2-hydroxyphenylmethane, bis(3-cyclohexyl-4-hydroxy-6-methylphenyl)-2-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(4-hydroxy-3,5-dimethylphenyl)-2-hydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, and 1-[1-(4-hydroxyphenyl)isopropyl]-4-[1,1-bis(4-hydroxyphenyl)ethyl]benzene. In addition, examples of the polyphenol compound include a tetramer obtained by formalin condensation of phenols such as phenol, m-cresol, p-cresol, or xylenol.

A polymer compound of the present invention and a low molecular compound, which are used for a photoresist composition and contain the specific acid dissociable, dissolution inhibiting group (ii), can be obtained as follows: synthesizing a halogenated methylether compound containing at least one halogen atom as a starting material and a precursor of an acid dissociable, dissolution inhibiting group (ii); and reacting this halogenated methylether compound with a low molecular or polymer compound containing an alkali soluble group (i).

For example, the polymer compound and the low molecular compound which are used for a photoresist composition can be obtained by reacting a chloromethylether compound with a low molecular or polymer compound containing at least one substituent group selected from an alcoholic hydroxyl group, a carboxyl group, or a phenolic hydroxyl group.

The chloromethylether compound can be synthesized by the following reaction formula. In other words, the desired chloromethylether compound can be obtained as follows: adding paraformaldehyde to an alcohol compound; injecting a hydrogen chloride gas at 2.0 to 3.0 equivalent amount per this alcohol compound; conducting the reaction at temperature of 40° C. to 100° C. under acid conditions due to a hydrochloric acid; and conducting distillation under reduced pressure of the product after completion of the reaction.

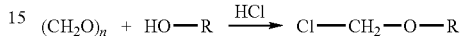

In a polymer compound of the present invention and a low molecular compound for a photoresist composition, a polymer compound containing the protected phenolic hydroxyl group can be obtained by reacting a polyhydroxystyrene resin represented by the chemical formula (20) with the halogenated methylether compound, for example. In a similar way, a low molecular compound containing the protected phenolic hydroxyl group can also be obtained by reacting a corresponding low molecular polyphenol compound with the halogenated methylether compound.

In a polymer compound of the present invention and a low molecular compound for a photoresist composition, a polymer compound containing the protected carboxyl group can be obtained as follows: reacting the halogenated methylether compound with an unsaturated carboxylic acid such as an acrylic acid or a methacrylic acid; and polymerizing the obtained unsaturated carboxylate as a monomer with other monomers containing a carboxyl group, such as an acrylic acid or a methacrylic acid, for example. In a similar way, a low molecular compound containing the protected carboxyl group can also be obtained by reacting the corresponding bile acid with the halogenated methylether compound.

In a polymer compound of the present invention and a low molecular compound for a photoresist composition, a polymer compound containing the protected alcoholic hydroxyl group can be obtained by reacting the polymer containing a fluoroalcohol or an alcohol with the halogenated methylether compound, for example. In a similar way, a low molecular compound containing the protected alcoholic hydroxyl group can also be obtained by reacting the corresponding low molecular compound containing a fluoroalcohol or an alcohol bile acid with the halogenated methylether compound.

As described above, a polymer compound of the present invention and a low molecular compound for a photoresist composition, in which an alkali soluble group (i) is protected by an acid dissociable, dissolution inhibiting group (ii) represented by the above general formula (1), can be obtained by reacting the obtained halogenated methylether compound with the polymer compound or the low molecular compound containing at least one alkali soluble group (i) selected from an alcoholic hydroxyl group, a carboxyl group, or a phenolic hydroxyl group.

A photoresist composition of a second aspect of the present invention includes at least a base material resin component (A) which exhibits changed alkali solubility under the action of acid; and an acid generator component (B) which generates the acid on exposure to radiation. The content of an acid generator component (B) is 0.5 to 30 parts by mass per 100 parts by mass of a base material resin component (A). The base material resin component (A) is the polymer compound of the first aspect. In addition, the photoresist composition further includes the aforementioned low molecular compound for a photoresist composition as an acid dissociable, dissolution inhibitor (C).

When the polymer compound is used in the system of a chemically amplified positive resist of the present invention, a dissolution inhibiting effect in an alkali developing solution is shown before exposure, whereas alkali solubility due to deprotection is shown after exposure and a PEB process because the polymer compound contains a hydrophilic, acid dissociable, dissolution inhibiting group (ii) represented by the aforementioned general formula (1). Thus, the alkali solubility is greatly changed before and after exposure in the chemically amplified positive resist, so it is possible to provide a fine pattern with high resolution. Also, it is possible to prevent thickness loss of a resist pattern. Also, it is possible to improve the adhesion of a resist pattern to a substrate due to the effect of an introduced hydrophilic group, and to reduce the developing defects due to the improved affinity of a resist pattern to an alkali developing solution.

Also, when the low molecular compound for a photoresist composition is used in the system of a chemically amplified positive resist of the present invention, a dissolution inhibiting effect in an alkali developing solution is shown before exposure, whereas an alkali solubility due to deprotection is shown after exposure and a PEB process because the low molecular compound for a photoresist composition contains a hydrophilic, acid dissociable, dissolution inhibiting group (ii) represented by the aforementioned general formula (1). Thus, the alkali solubility is greatly changed before and after exposure in the aforementioned chemically amplified positive resist, so it is possible to provide a fine pattern with high resolution. Also, it is possible to prevent thickness loss of a resist pattern. Also, it is possible to improve the adhesion of a resist pattern to a substrate due to the effect of an introduced hydrophilic group, and to reduce the developing defects due to the improved affinity of a resist pattern to an alkali developing solution.

The acid dissociable, dissolution inhibitor (C) is used in a range of usually 3 to 50 parts by mass, preferably 5 to 30 parts by mass, more preferably 5 to 15 parts by mass per 100 parts by mass of a base material resin component (A). When the content of the acid dissociable, dissolution inhibitor (C) is within the above range, improvements in resolution and a pattern shape can be obtained without deteriorating the sensitivity or the storage stability of a photoresist coating liquid.

Meanwhile, the known acid generators (B) used in a conventional chemically amplified photoresist composition can be used without any limitation as a component (B) used in a photoresist composition of the present invention.

Examples of the acid generator (B) include an onium salt-type acid generator such as iodonium salt or sulfonium salt; an oxime sulfonate-type acid generator; a diazomethane-type acid generator such as bisalkyl- or bisaryl-sulfonyldiazomethanes, poly(bissulfonyl)diazomethanes, or diazomethanenitrobenzylsulfonates; an iminosulfonate-type acid generator; or a disulfonic acid-type acid generator. Various acid generators have been proposed as described above, although preferable examples include an onium salt such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, triphenylsulfonium nonafluorobutanesulfonate. Among them, a sulfonium salt containing an anion of fluorinated alkyl sulfonic acid ion is preferable because it has an appropriate acid strength and diffusivity in a resist film.

An acid generator (B) can be used singularly or in a mixture of two or more. Also, the content thereof is for example 0.5 to 30 parts by mass per 100 parts by mass of a base material resin component (A), preferably 1 to 20 parts by mass, more preferably 3 to 15 parts by mass. When the content of an acid generator (B) is within the above range, sufficient latent image formation can be obtained without deteriorating storage stability of a photoresist compound.

The photoresist composition can further include a nitrogen-containing compound (D) according to need. It is generally known that a small amount of a nitrogen-containing compound can be added to a chemically amplified resist composition as an acid diffusion inhibitor. In the present invention, a generally known nitrogen-containing compound can be added. Examples of the nitrogen-containing compound include an amine and an ammonium salt.

Examples of the amine include an aliphatic secondary amine such as diethylamine, dipropylamine, dibutylamine, or dipentylamine; an aliphatic tertiary amine (that is, a trialkylamine in which three alkyl groups bonded to nitrogen can be the same or different.) such as trimethylamine, triethylamine, tripropylamine, tributylamine, tripentylamine, N,N-dimethylpropylamine, N-ethyl-N-methylbutylamine, trihexylamine, triheptylamine, trioctylamin, tridecanylamine, tridodecylamine, or tritetradecanylamine; a tertiary alkanolamine such as N,N-dimethylmonoethanolamine, triisopropanolamine, N,N-diethylmonoethanolamine, triethanolamine, or tributanolamine; an aromatic tertiary amine such as N,N-dimethylaniline, N,N-diethylaniline, N-ethyl-N-methylaniline, N,N-dimethyltoluidine, N-methyldiphenylamine, N-ethyldiphenylamine, or triphenylamine.

Examples of the ammonium salt include salts of a quaternary alkyl ammonium ion such as an ammonium ion, a tetramethylammonium ion, a tetraethylammonium ion, a tetrapropylammonium ion, a tetrabutylammonium ion, or a tetrapentylammonium ion; and a hydroxyl group-containing organic carboxylic acid such as lactic acid.

Among them, preferable examples include a lower tertiary alkanolamine containing 6 to 12 carbon atoms such as triethanolamine, triisopropanolamine, or tributanolamine; and a trialkylamine containing 6 to 15 carbon atoms such as trihexylamine, triheptylamine, trioctylamin, tridecanylamine, tridodecylamine, or tritetradecanylamine because these are excellent in reducing thickness loss in the top part of a fine resist pattern.

A nitrogen-containing compound (D) can be used in a range of usually 0.01 to 5 parts by mass per 100 parts by mass of a base material component (A), preferably 0.05 to 3 parts, more preferably 0.1 to 2 parts by mass. When the content of a nitrogen-containing compound (D) is within the above range, it is possible to obtain an improvement in a pattern shape due to a diffusion inhibiting effect of acid generated on exposure and to prevent a so-called deterioration of exposure sensitivity due to an excessive inhibition of acid diffusion.

Also, a photoresist of the present invention can include an organic carboxylic acid, or an oxoacid of phosphorous or a derivative thereof as an optional component so as to prevent the deterioration of sensitivity due to the addition of a nitrogen-containing compound (D).

Preferable examples of the organic carboxylic acid include malonic acid, citric acid, malic acid, succinic acid, benzoic acid, and salicylic acid. Examples of the oxoacid of phosphorous or the derivative thereof include phosphoric acid or an ester derivative thereof such as phosphoric acid, di-n-butyl phosphate, or diphenyl phosphate; phosphonic acid or a derivative thereof such as phosphonic acid, dimethyl phosphonate, di-n-butyl phosphonate, phenylphosphonic acid, diphenyl phosphonate, or dibenzyl phosphonate; phosphinic acid or an ester derivative thereof such as phosphinic acid or phenylphosphinic acid, although phosphonic acid is particularly preferable among them.

The organic carboxylic acid, or the oxoacid of phosphorous or the derivative thereof can be used in a range of 0.01 to 5.0 parts by mass per 100 parts by mass of a base material component (A), preferably 0.05 to 3 parts, more preferably 0.1 to 2 parts by mass. When the content of the organic carboxylic acid, or the oxoacid of phosphorous or the derivative thereof is within the above range, it is possible to prevent the deterioration of sensitivity due to the addition of a nitrogen-containing compound (D).

The photoresist composition of the present invention can be produced by dissolving the base material resin component (A), the acid generator (B), the acid dissociable, dissolution inhibitor (C), the nitrogen-containing compound (D), and an optional component according to need in an organic solvent and used as a homogeneous solution. Specific examples of the organic solvent include ketones such as acetone, methyl ethyl ketone, cyclohexanone, methyl isoamyl ketone, or 2-heptanone; polyhydric alcohols and derivatives thereof such as ethylene glycol, ethylene glycol monoacetate, diethylene glycol, diethylene monoacetate, propylene glycol, propylene glycol monoacetate, dipropylene glycol, or the monomethyl ether, monoethyl ether, monopropyl ether, monobutyl ether, or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or in a mixed solvent of two or more different solvents. Among them, particularly preferable examples include propylene glycol monomethyl ether acetate (PGMEA) and ethyl lactate (EL).

The amount of an organic solvent is determined so as to obtain a concentration such that a photoresist composition can be coated on a substrate to form a photoresist film.

A photoresist composition of the present invention can further include miscible additives such as generally known dissolution inhibitors, additive resins for improving properties of a photoresist film, surfactants for improving coating property, plasticizers, stabilizers, colorants, and halation prevention agents according to need.

A resist pattern formation method of a third aspect of the present invention includes forming a photoresist film on a substrate using the aforementioned photoresist composition; exposing the photoresist film; and developing the exposed photoresist film to form a resist pattern.

A photoresist composition of the present invention forms a resist pattern according to a conventional lithography process. In detail, firstly, a photoresist composition is coated on a substrate by means of spin-coating or the like, and then dried to form a resist film. Next, the formed resist film is selectively exposed through a mask pattern or by means of electron-beam printing, and then PEB (Post Exposure Baking) is performed. Finally, the exposed resist film is developed using an alkaline aqueous solution to form a resist pattern. Meanwhile, a post baking process can be performed according to need.

There is no limitation regarding the light source, although examples of the light source include a far-UV ray with a wavelength of 300 nm or less, specifically a KrF excimer laser, an ArF excimer laser, an $F_2$ excimer laser, EUV (extreme ultraviolet light), an electron beam, soft X ray, or X ray. Particularly preferable examples of the light source include an ArF excimer laser and an $F_2$ excimer laser.

The conditions for a lithography process including the rotation number of the resist coating, the prebaking temperature, exposure conditions, PEB conditions, alkali development conditions can be those conventionally used. In detail, the rotation number is about 500 to 5,000 rpm, specifically about 1,200 to 3,500 rpm. The prebaking temperature is within a range of 70° C. to 130° C. These conditions form a resist film with a thickness of 80 to 250 nm. Exposure can be performed through a mask. A generally known mask such as a binary mask or a phase-shift mask can be used as a mask for selective exposure. The heating temperature of PEB is within a range of 90° C. to 140° C. As for alkali development conditions, the development is performed using an alkaline developer such as a 1% to 5% by mass of TMAH (tetramethyl ammonium hydroxide) developer at a temperature of 15° C. to 30° C., specifically 23° C., for 15 to 90 seconds, followed by rinsing with water.

EXAMPLES

Example 1

Synthesis Example 1

Introduction of 1-chloromethoxy-2-methoxyethane to an Alkali Soluble Resin

Hereinafter, resins represented by the following formulae (25) to (30) are referred to as resins 1 to 6, respectively.

Resins 3 to 6 were obtained by introducing 1-chloromethoxy-2-methoxyethane represented by the following formula (24) to the commercially available resins 1 and 2 synthesized by addition polymerization or radical polymerization and represented by the following formulae (25) and (26), respectively. Results of chemical analysis of resins 1 to 6 are shown in Table 1.

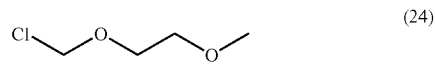
(24)

(25)

(26)

-continued

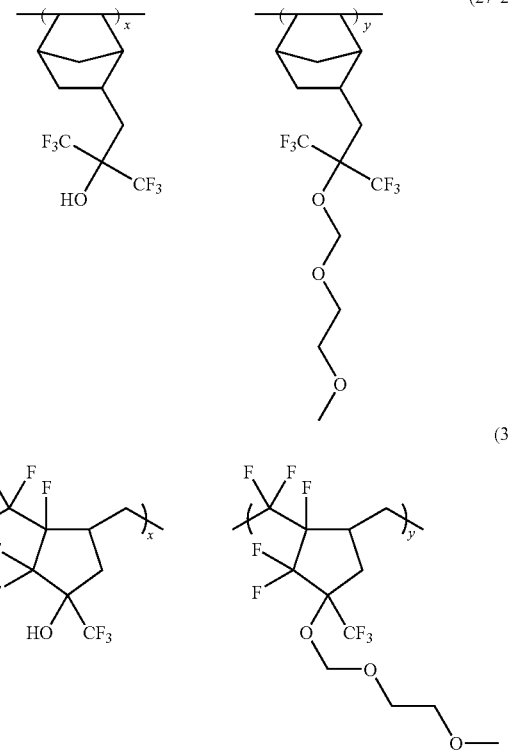

(27-29)

(30)

Resin Synthesis Example 1

In 100 ml of tetrahydrofuran, 10.0 g of resin 1 (formula (25)) was dissolved, and then 0.48 g of sodium hydride was added. After stirring until the solution system became homogeneous at room temperature, 1.36 g of the 1-chloromethoxy-2-methoxyethane compound (formula (24)) was added dropwise. After stirring at room temperature for 12 hours, the precipitated salt was removed by filtration. The obtained filtrate was added dropwise to 1 L of water. The precipitated resin was separated by filtration, dried under reduced pressure, and then dissolved in tetrahydrofuran. This resin solution was added dropwise to 1 L of a mixed solvent of methanol:pure water (80:20). The precipitated resin was separated by filtration, and dried under reduced pressure, and then a white powder resin was obtained. This resin was referred to as the resin 3 (formula (27)).

Resin Synthesis Example 2

In 70 ml of tetrahydrofuran, 5.4 g of resin 1 (formula (25)) was dissolved, and then 0.14 g of sodium hydride was added. After stirring until the solution system became homogeneous at room temperature, 0.75 g of the 1-chloromethoxy-2-methoxyethane compound (formula (24)) was added dropwise. After stirring at room temperature for 12 hours, the precipitated salt was removed by filtration. The obtained filtrate was added dropwise to 1 L of water. The precipitated resin was separated by filtration, dried under reduced pressure, and then dissolved in tetrahydrofuran. This resin solution was added dropwise to 1 L of the mixed solvent of methanol:pure water (80:20). The precipitated resin was separated by filtration, and dried under reduced pressure, and then a white powder resin was obtained. This resin was referred to as the resin 4 (formula (28)).

Resin Synthesis Example 3

In 70 ml of tetrahydrofuran, 5.4 g of resin 1 (formula (25)) was dissolved, and then 0.05 g of sodium hydride was added. After stirring until the solution system became homogeneous at room temperature, 0.24 g of the 1-chloromethoxy-2-methoxyethane compound (formula (24)) was added dropwise. After stirring at room temperature for 12 hours, the precipitated salt was removed by filtration. The obtained filtrate was added dropwise to 1 L of water. The precipitated resin was separated by filtration, dried under reduced pressure, and then dissolved in tetrahydrofuran. This resin solution was added dropwise to 1 L of a mixed solvent of methanol:pure water (80:20). The precipitated resin was separated by filtration, and dried under reduced pressure, and then a white powder resin was obtained. This resin was referred to as the resin 5 (formula (29)).

Resin Synthesis Example 4

In 200 ml of tetrahydrofuran, 6.0 g of resin 1 (formula (26)) was dissolved, and then 0.29 g of sodium hydride was added. After stirring until the solution system became homogeneous at room temperature, 1.15 g of the 1-chloromethoxy-2-methoxyethane compound (formula (24)) was added dropwise. After stirring at room temperature for 12 hours, the precipitated salt was removed by filtration. The obtained filtrate was added dropwise to 1 L of water. The precipitated resin was separated by filtration, dried under reduced pressure, and then dissolved in tetrahydrofuran. This resin solution was added dropwise to 1 L of a mixed solvent of methanol:pure water (80:20). The precipitated resin was separated by filtration, and dried under reduced pressure, and then a white powder resin was obtained. This resin was referred to as the resin 6 (formula (30)).

(Table 1)

TABLE 1

Physical properties values of resins 1 to 6

|  | Molecular weight (Mw) | Degree of dispersion (Mw/Mn) | Composition ratio (x/y) |
|---|---|---|---|
| Resin 1 | 8,500 | — | — |
| Resin 2 | 10,900 | — | — |
| Resin 3 | 9,000 | 1.67 | 0.8/0.2 |
| Resin 4 | 8,890 | 1.69 | 0.89/0.11 |
| Resin 5 | 9,440 | 1.71 | 0.96/0.04 |
| Resin 6 | 15,000 | 2.0 | 0.9/0.1 |

Example 2

Confirmation of the Exposure Resolution of a Positive Photoresist

An organic anti-reflective film composition (trade name "AR-19", manufactured by Shipley Ltd.) was coated on top of an 8-inch diameter silicon wafer by using a spinner and dried by baking at 215° C. for 90 seconds, thereby forming an organic anti-reflective film with a thickness of 82 nm. Then, the positive photoresist composition described below was coated on the organic anti-reflective film by using a spinner and then dried by prebaking on a hotplate at 110° C. for 90 seconds, thereby forming a photoresist layer with a film thickness of 200 nm. Subsequently, the photoresist layer was selectively exposed to an ArF excimer laser (193 nm) using an ArF exposure apparatus NSR-S302 (manufactured by Nikon Corporation, NA (numerical aperture)=0.60, 2/3 annular) through a mask pattern (6% transmittance half-tom mask). Then, the exposed photoresist was subjected to a PEB treatment at 90° C. for 60 seconds followed by puddle development for 30 seconds at 23° C. in a 2.38% by mass aqueous solution of tetramethylammonium hydroxide, rinsed with pure water for 20 seconds, and then dried so as to form a resist pattern.

As a result, a line and space pattern with a line width of 120 nm was obtained, and the pattern shape showed rectangularity. The exposure in Example 2 was 14 mJ/cm².

Composition of the Positive Photoresist:

The positive photoresist composition was prepared by using an acid generator, a quencher, and a solvent, each being described below.

| | |
|---|---|
| Resin 3 (formula (27)): | 100 parts by mass |
| Acid generator: triphenylsulfonium perfluorobutanesulfonate (TPS-PFBS) | 2 parts by mass |
| Quencher (nitrogen-containing compound): triisopropanolamine | 0.2 parts by mass |
| Organic solvent: propylene glycol monomethyl ether acetate (PGMEA) | 1250 parts by mass |

According to the above evaluation of the exposure resolution, as for the positive photoresist composition (Example 2) including resin 3, which is one example of a polymer compound of the present invention, it was found that a line and space pattern with a line width of 120 nm was obtained and that the pattern shape showed rectangularity. The exposure in Example 2 was 14 mJ/cm².

As for the positive photoresist composition including the resins 4 to 6, a line and space pattern with a line width of 120 nm was obtained, and the pattern shape showed rectangularity in the same fashion as resin 3.

INDUSTRIAL APPLICABILITY

As described above, a polymer compound of the present invention is useful for formation of a fine pattern with high resolution, specifically a fine pattern for exposure of a KrF, ArF, or F₂ laser because the alkali solubility is greatly changed before and after exposure in a chemically amplified positive resist so that thickness loss of a pattern is small.

The invention claimed is:

1. A photoresist composition comprising:
   a base material resin component (A) which exhibits changed alkali solubility under the action of acid;
   an acid generator component (B) which generates the acid on exposure to radiation; and
   at least one nitrogen-containing compound (D) selected from tertiary alkanolamines containing 6 to 12 carbon atoms, wherein
   the base material resin component (A) is a polymer compound comprising:
   an alkali soluble group (i), wherein
   at least one hydrogen atom of a hydroxyl group in the alkali soluble group (i) is protected by an acid dissociable, dissolution inhibiting group (ii) represented by the general formula (1):

—CH₂—O—R       (1)

(wherein R represents an organic group of formula (2))

(2)

2. A photoresist composition according to claim 1, wherein the alkali soluble group (i) is selected from the group consisting of an alcoholic hydroxyl group, a phenolic hydroxyl group, and a carboxyl group.

3. A photoresist composition according to claim 2, wherein a carbon atom adjacent to the carbon atom connected to the alcoholic hydroxyl group is bonded to at least one fluorine atom.

4. A photoresist composition according to claim 1, wherein the hydrophilic group is selected from the group consisting of a carbonyl group, an ester group, an alcoholic hydroxyl group, an ether group, an imino group, and an amino group.

5. A resist pattern formation method comprising:
   forming a photoresist film an a substrate using the photoresist composition according to claim 1;
   exposing the photoresist film; and
   developing the exposed photoresist film to form a resist pattern.

6. A polymer compound comprising: an alkali soluble group (i), wherein
   at least one hydrogen atom of a hydroxyl group in the alkali soluble group (i) is protected by an acid dissociable, dissolution inhibiting group (ii) represented by a general formula (1):

—CH2—O—R       (1)

(wherein R represents an organic group containing no more than 20 carbon atoms and at least one hydrophilic group),
the polymer compound exhibits changed alkali solubility under the action of acid, and
the hydrophilic group is at least one selected from the group consisting of a carbonyl group, an ester group, an imino group and an amino group.

* * * * *

UNITED STATES PATENT AND TRADEMARK OFFICE
CERTIFICATE OF CORRECTION

PATENT NO. : 7,807,328 B2
APPLICATION NO. : 10/588866
DATED : October 5, 2010
INVENTOR(S) : Ogata et al.

It is certified that error appears in the above-identified patent and that said Letters Patent is hereby corrected as shown below:

Column 11, Line 23, change "acid" to --acid.--.

Column 14, Line 29, change "trioctylamin," to --trioctylamine,--.

Column 14, Line 47, change "trioctylamin," to --trioctylamine,--.

Column 19, Line 7, change "half-tom" to --half-torn--.

Column 20, Line 33, (Approx.), In Claim 5, change "an" to --on--.

Column 20, Line 45, in Claim 6, change "–CH2–O–R" to -- –CH$_2$–O–R--.

Signed and Sealed this
Fifth Day of April, 2011

David J. Kappos
*Director of the United States Patent and Trademark Office*